(12) United States Patent
Matsuno et al.

(10) Patent No.: US 7,208,801 B2
(45) Date of Patent: Apr. 24, 2007

(54) NONVOLATILE SEMICONDUCTOR MEMORY DEVICE AND METHOD OF MANUFACTURING THE SAME

(75) Inventors: Koichi Matsuno, Mie-gun (JP); Tadashi Iguchi, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 11/137,652

(22) Filed: May 26, 2005

(65) Prior Publication Data

US 2005/0265112 A1 Dec. 1, 2005

(30) Foreign Application Priority Data

May 28, 2004 (JP) ............................. 2004-159952

(51) Int. Cl.
*H01L 29/94* (2006.01)
(52) U.S. Cl. ...................... 257/396; 257/316; 257/330; 257/E29.26; 438/259

(58) Field of Classification Search ................. 257/396
See application file for complete search history.

(56) References Cited

U.S. PATENT DOCUMENTS

2004/0000688 A1* 1/2004 Harari et al. ............... 257/315

FOREIGN PATENT DOCUMENTS

JP 2002-176114 6/2002

* cited by examiner

*Primary Examiner*—Tu-Tu Ho
(74) *Attorney, Agent, or Firm*—Oblon, Spivak, McClelland, Maier & Neustadt, P.C.

(57) ABSTRACT

A nonvolatile semiconductor memory device whose gate structure of a transistor other than a memory cell transistor has a same stacked gate structure as the memory cell transistor, the gate structure comprising a semiconductor substrate, a first insulation film provided on the semiconductor substrate, a first conductive film provided on the first insulation film, a second insulation film, provided on the first conductive film, having an opening, a spacer provided on the second insulation film to define the opening, and a second conductive film provided on the spacer and electrically connected to the first conductive film via the opening.

8 Claims, 7 Drawing Sheets

FIG. 20

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2004-159952, filed May 28, 2004, the entire contents of which are incorporated herein by reference.

BACKGROUND OF THE INVENTION

1. Field of the Invention

The present invention relates generally to a nonvolatile semiconductor memory device, and more particularly to a flash memory with a floating gate.

2. Description of the Related Art

Various structures and fabrication techniques relating to flash memories with floating gates have been proposed. Jpn. Pat. Appln. KOKAI Publication No. 2002-176114, for instance, discloses a nonvolatile semiconductor memory device wherein the gate structure of a transistor, other than a memory cell transistor, has the same stacked-gate structure as the memory cell transistor. In this nonvolatile semiconductor memory device, the gate structure is configured such that a floating gate and a control gate are connected via an opening, i.e. a slit, that is formed in an ONO film.

When such a slit is formed in the ONO film, however, the width of the slit varies greatly, leading to difficulty in control of dimensions. Thus, an exact slit width cannot be obtained.

BRIEF SUMMARY OF THE INVENTION

According to a first aspect of the present invention, there is provided a nonvolatile semiconductor memory device whose gate structure of a transistor other than a memory cell transistor has a same stacked gate structure as the memory cell transistor, the gate structure comprising: a semiconductor substrate; a first insulation film provided on the semiconductor substrate; a first conductive film provided on the first insulation film; a second insulation film, provided on the first conductive film, having an opening; a spacer provided on the second insulation film to define the opening; and a second conductive film provided on the spacer and electrically connected to the first conductive film via the opening.

According to a second aspect of the present invention, there is provided a method of manufacturing a nonvolatile semiconductor memory device whose gate structure of a transistor other than a memory cell transistor has a same stacked gate structure as the memory cell transistor, the method of making the gate structure comprising: successively depositing a first insulation film, a first doped polysilicon film and a second insulation film on a semiconductor substrate; depositing a second undoped polysilicon film on the second insulation film; selectively removing the second undoped polysilicon film until the second insulation film is exposed, using a photoresist film having a first opening with a first opening width; depositing, after the photoresist film is removed, a third doped polysilicon film on a surface of the substrate; selectively removing, by RIE, the third doped polysilicon film and the second insulation film in a vertical direction from a bottom of the first opening, using the third doped polysilicon film as a spacer, to define a second opening with a second opening width that is less than the first opening width; and forming a conductive film on the surface of the substrate.

BRIEF DESCRIPTION OF THE DRAWINGS

FIGS. 2A and 2B to 8A and 8B are cross-sectional views that schematically show a gate structure of a cell transistor and a gate structure of a transistor other than the cell transistor in a fabrication process of the nonvolatile semiconductor memory device according to a first embodiment of the invention;

FIGS. 9A and 9B to 11A and 11B are cross-sectional views that schematically show a gate structure of a cell transistor and a gate structure of a transistor other than the cell transistor in a fabrication process of the nonvolatile semiconductor memory device according to a second embodiment of the invention;

FIGS. 13A and 13B to 17A and 17B are cross-sectional views that schematically show a gate structure of a cell transistor and a gate structure of a transistor other than the cell transistor in a fabrication process of the nonvolatile semiconductor memory device according to the reference example;

DETAILED DESCRIPTION OF THE EMBODIMENTS

Prior to a description of embodiments of the present invention, a reference example is first described. In the FIGS. (A) and (B) correspond to an $X_0$-$X_0$ cross section and a $Y_0$-$Y_0$ cross section in a plan view of FIG. 1.

Figure 13A:
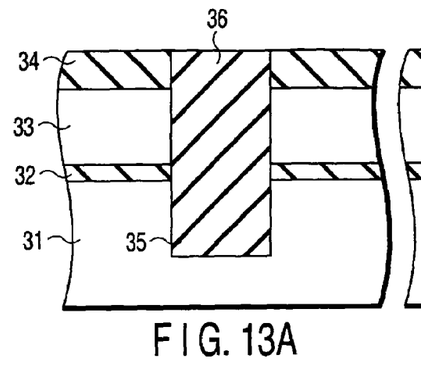
Figure 13B:
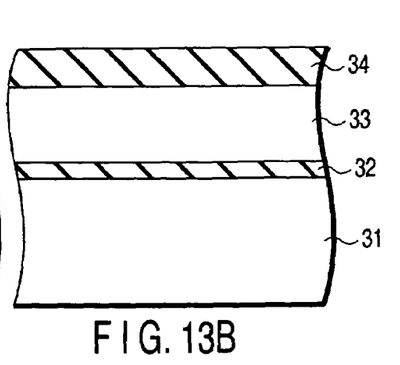

As is shown in FIGS. 13A and 13B, a first gate oxide film 32 with a thickness of 8 nm, a first P (phosphorus) doped polysilicon film 33 that is formed to a thickness of 160 nm by reduced-pressure CVD, and a first silicon nitride film 34 with a thickness of 70 nm are successively deposited on a P-type semiconductor substrate 31 or a P-type well that is formed in a semiconductor substrate.

A photoresist is processed to have a desired pattern by a lithography technique, and it is used as a mask to perform RIE (Reactive Ion Etching). By the RIE, the first silicon nitride film 34, polysilicon film 33, first gate oxide film 32 and semiconductor substrate 31 are processed to form a trench 35.

The trench 35 is filled with a second silicon oxide film 36, which is deposited to a thickness of 550 nm by an HDP (High Density Plasma) method. Then, the second silicon oxide film 36 is planarized by CMP (Chemical Mechanical Polishing) until the first silicon nitride film 34 is exposed. After heating the semiconductor substrate 31 at 900° C. in a nitrogen atmosphere, the first silicon nitride film 34 is removed by a phosphoric-acid process at 150° C. The second silicon oxide film 36 that is buried in the trench 35 is etched back so as to expose a part of an inner wall of the doped polysilicon film 33.

Figure 14A:
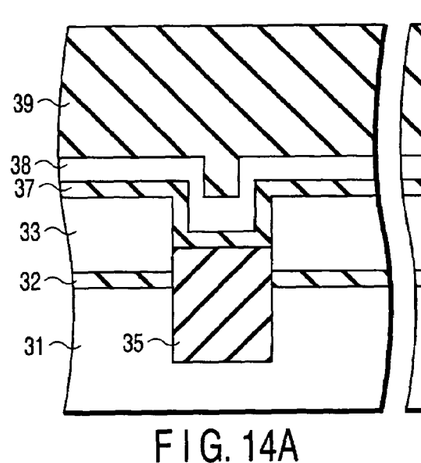
Figure 14B:
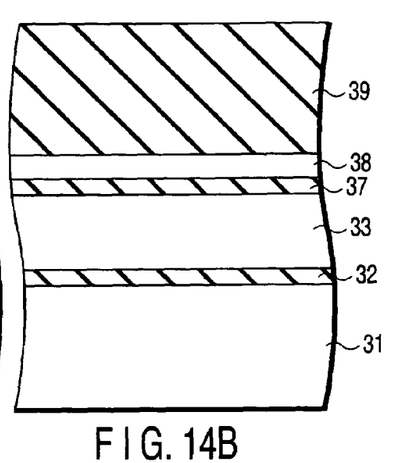

As is shown in FIGS. 14A and 14B, an ONO film 37 is deposited on the surface of the substrate. The ONO film 37 comprises a silicon oxide film with a thickness of 5 nm, a silicon nitride film with a thickness of 7 nm and a silicon oxide film with a thickness of 5 nm, and has a total thickness of 17 nm. The resultant structure is heated in an oxidizing atmosphere.

Subsequently, a second undoped polysilicon film 38 is grown to a thickness of 400 Å (angstrom) by reduced-pressure CVD, and a BSG (Boron-doped Silicate Glass) film 39 with a thickness of 500 nm is formed by reduced-pressure CVD.

Figure 15A:
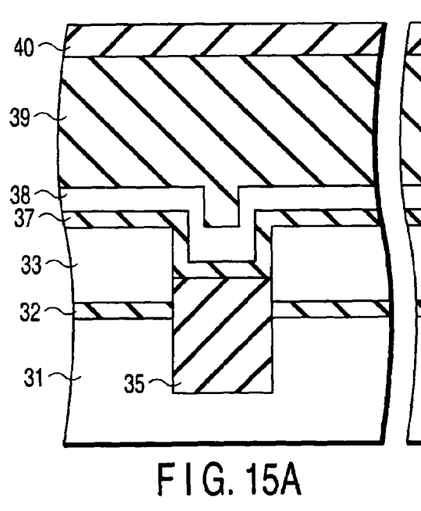
Figure 15B:
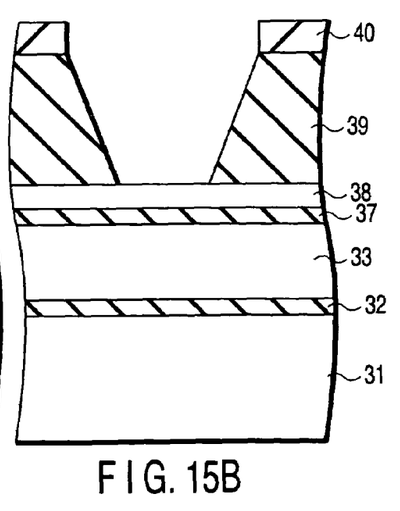

As is shown in FIGS. 15A and 15B, a photoresist film is processed by the lithography technique to have a pattern 40 with a space of 220 nm, and the pattern 40 is used as a mask to etch back, by RIE, the BSG film 39 so as to form a taper having an angle of, e.g. about 83°.

Figure 16A:
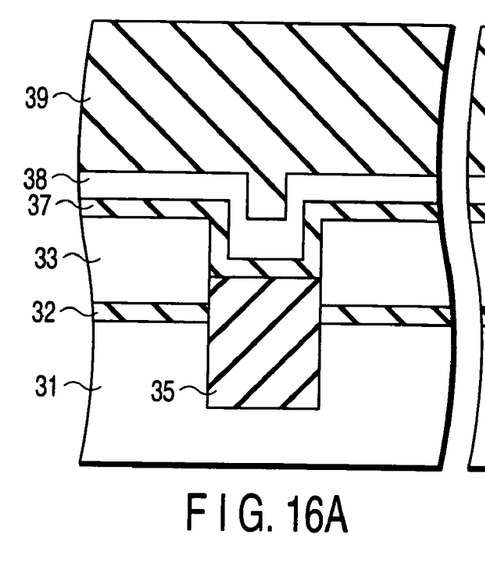
Figure 16B:
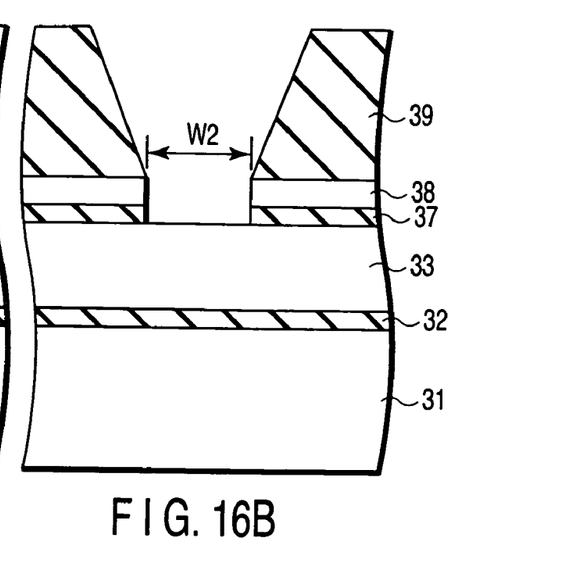

As shown in FIGS. 16A and 16B, the photoresist film is removed, and the BSG film 39 is used as a mask to vertically etch, by RIE, the second undoped polysilicon film 38 and ONO film 37. Thereby, the ONO film 37 has a slit width w2 of about 100 nm.

Figure 17A:
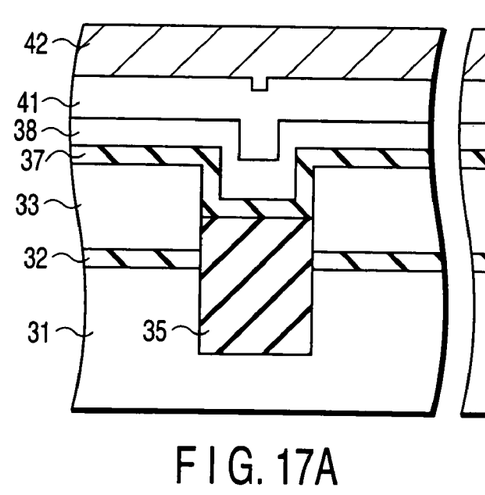
Figure 17B:
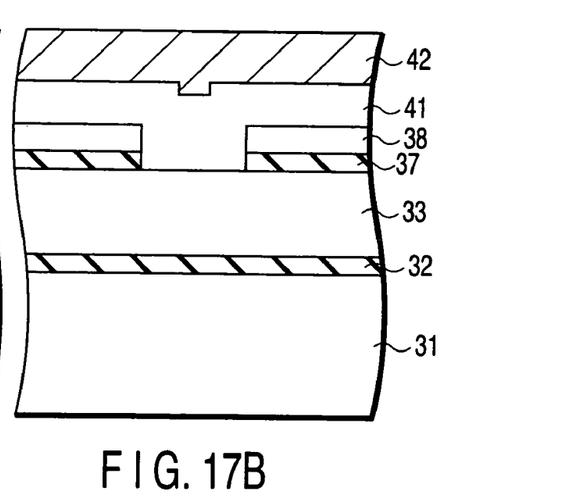

As is shown in FIGS. 17A and 17B, the BSG film 39 is removed by a hydrofluoric-acid process, following which a third P doped polysilicon film 41 is deposited to a thickness of 60 nm by reduced-pressure CVD. Further, a tungsten silicide film 42 is formed to a thickness of 800 Å by sputtering or CVD.

When the above technique is used, however, the slit width w2 in an inter-poly insulation film, i.e. the ONO film 37, varies greatly due to a change in thickness of the BSG film 39 or a change in taper angle at the time of etching back the BSG film 39.

Figure 18:
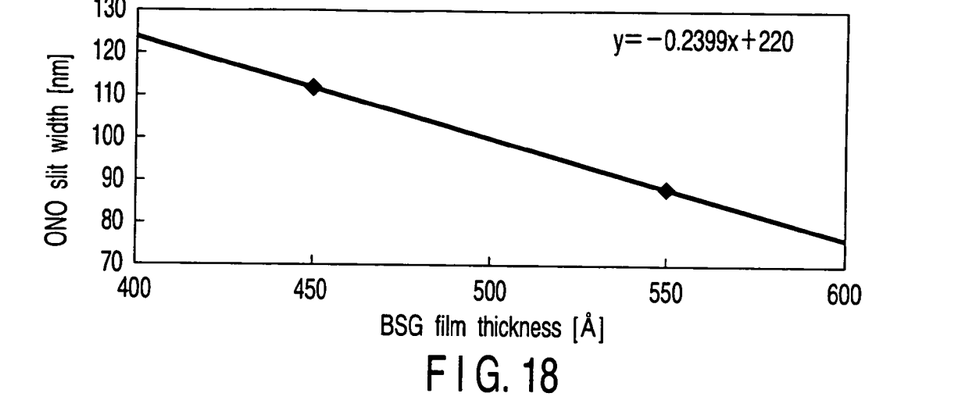
FIG. 18 is a graph showing the relationship between a BSG film thickness x and a slit width y.
Figure 19:
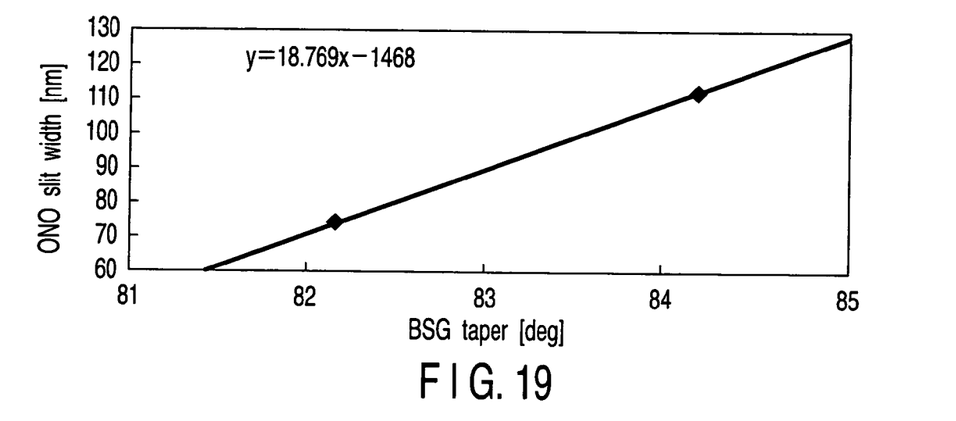
FIG. 19 is a graph showing the relationship between a taper angle x of a BSG film and a slit width y.
Figure 20:
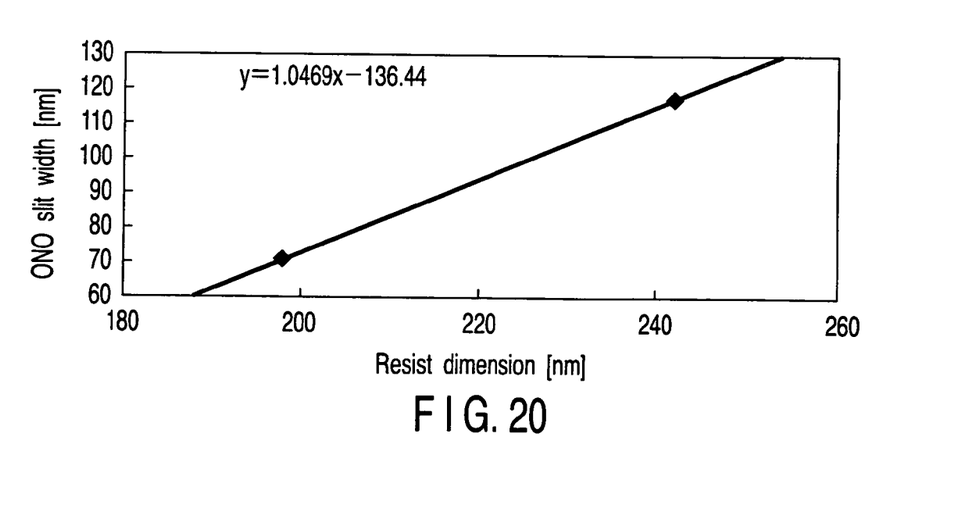
FIG. 20 is a graph showing the relationship between a resist dimension x and a slit width y.

FIG. 18 shows the relationship between the thickness x of the BSG film 39 and the slit width y. The slit width y is given by $y=-0.2399x+220$. FIG. 19 shows the relationship between the taper angle x of BSG film 39 and the slit width y that is given by $y=18.769x-1468$. FIG. 20 shows the relationship between the resist dimension x and the slit width y that is given by $y=1.0469x-136.44$.

Specifically, if the BSG film thickness varies ±10%, the slit width varies ±12 nm for a target value of 100 nm. If the taper angle varies ±1%, the slit width varies ±17 nm. If the resist dimension varies ±10%, the slit width varies ±22 nm. In the worst case, the variation becomes ±54 nm. In short, the control of dimensions is very difficult in consideration of misalignment in the lithography technique and etching of the inter-poly insulation film at the side wall of the slit due to the hydrofluoric-acid process for removing the BSG film. Furthermore, the number of process steps increases due to the process of forming and removing the BSG film.

Figure 1:
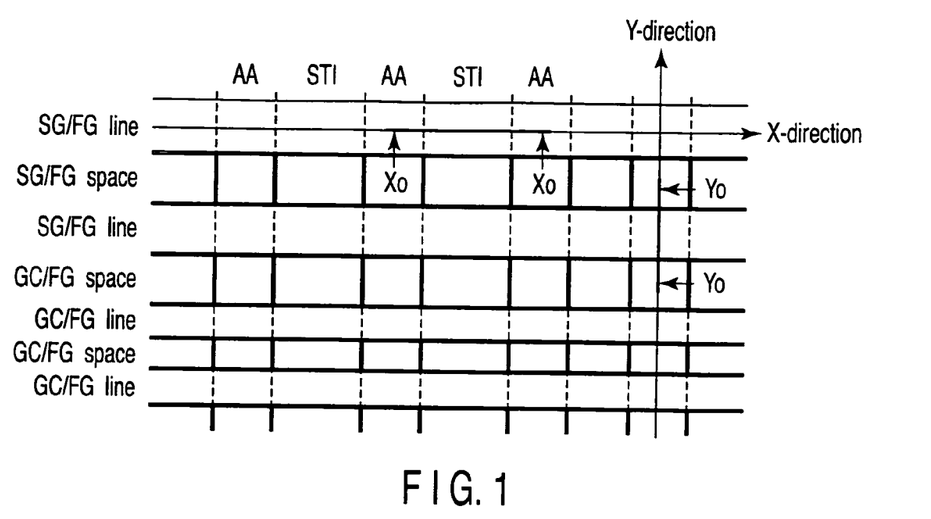
FIG. 1 is a plan view showing a nonvolatile semiconductor memory device according to embodiments of the present invention.

A nonvolatile semiconductor memory device with a floating gate and a method of manufacturing the same will now be described with reference to the accompanying drawings. FIG. 1 is a plan view showing a part of a nonvolatile semiconductor memory device according to a first embodiment of the invention. An SG/FG line, an SG/FG space, an SG/FG line, a GC/FG space, a GC/FG line, a GC/FG space and a GC/FG line are provided in the row direction. Active areas AA and shallow trench isolation regions STI are alternately arranged. The active areas AA and shallow trench isolation regions STI are successively arranged in the column direction.

Symbol SG designates a select gate, FG a floating gate, and GC a gate conductor. In the Figures that are referred to below, (A) corresponds to an $X_0$-$X_0$ cross section in an X-direction in FIG. 1, and (B) corresponds to a $Y_0$-$Y_0$ cross section in a Y-direction. (A) and (B) show, respectively, a gate structure of a cell transistor, and a gate structure of a transistor other than the cell transistor, for example, a select transistor in a peripheral circuit section.

Figure 2A:
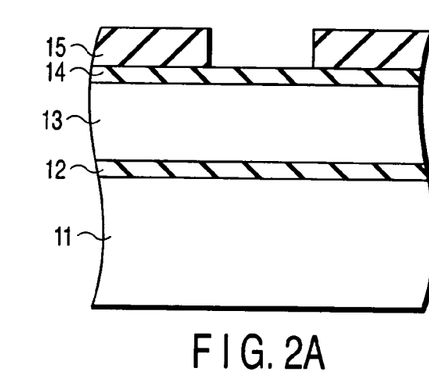
Figure 2B:
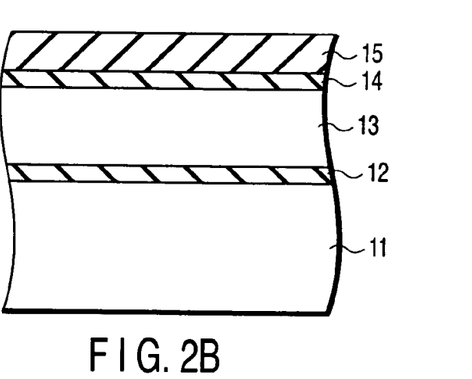

As is shown in FIGS. 2A and 2B, a first gate oxide film 12 with a thickness of 8 nm, a first P (phosphorus) doped polysilicon film 13 with a thickness of 160 nm deposited by reduced-pressure CVD, and a first silicon nitride film 14 with a thickness of 70 nm are successively deposited on a P-type semiconductor substrate 11 (or a P-type well formed in a semiconductor substrate). The first polysilicon film 13 will serve as a floating gate in the memory cell transistor. A photoresist film 15 is formed on the first silicon nitride film 14. The photoresist film 15 is processed to have a desired pattern by the lithography technique.

Figure 3A:
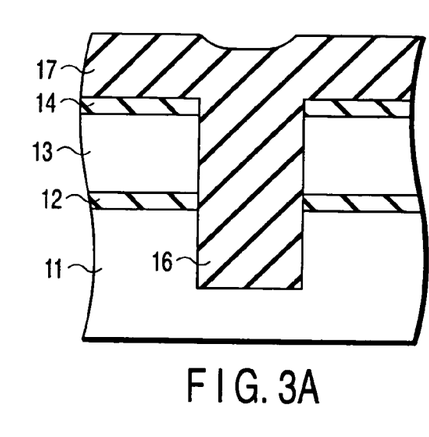
Figure 3B:
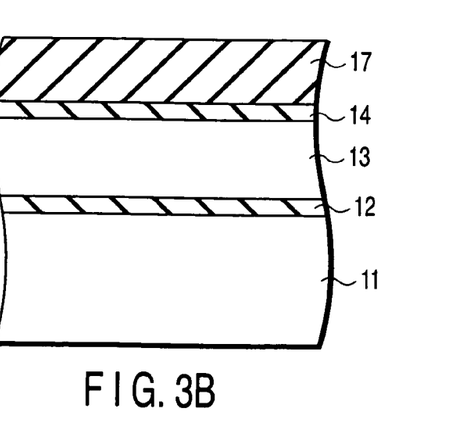

As is shown in FIGS. 3A and 3B, the photoresist film 15 is used as a mask to perform RIE (Reactive Ion Etching). By the RIE, the first silicon nitride film 14, polysilicon film 13, first gate oxide film 12 and semiconductor substrate 11 are processed to form a trench 16. Then, the trench 16 is filled with a second silicon oxide film 17, which is deposited to a thickness of 550 nm by an HDP (High Density Plasma) method.

Figure 4A:
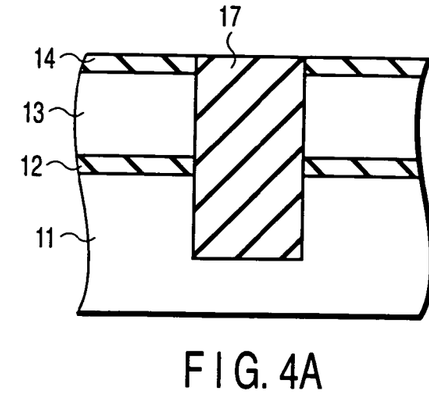
Figure 4B:
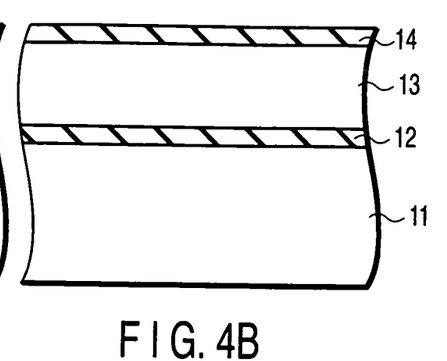

As is shown in FIGS. 4A and 4B, the second silicon oxide film 17 is polished and planarized by CMP (Chemical Mechanical Polishing) until the first silicon nitride film 14 is exposed.

Figure 5A:
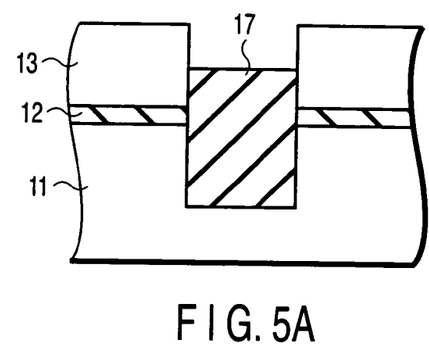
Figure 5B:
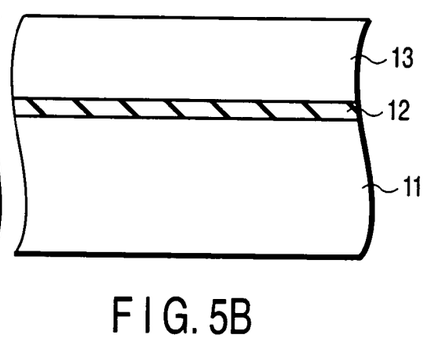

As is shown in FIGS. 5A and 5B, after heating the semiconductor substrate 11 at 900° C. in a nitrogen atmosphere, the first silicon nitride film 14 is removed by a phosphoric-acid process at 150° C. The second silicon oxide film 17 buried in the trench 16 is etched back so as to expose a part of an inner wall of the doped polysilicon film 13.

Figure 6A:
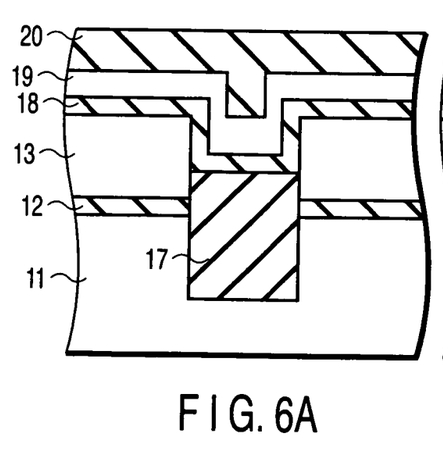
Figure 6B:
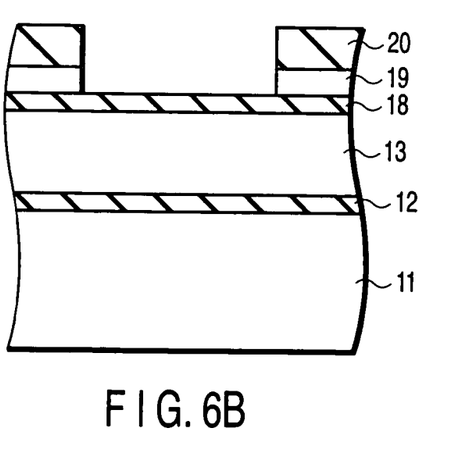

As is shown FIGS. 6A and 6B, an ONO film 18 with a thickness of 17 nm is deposited on the surface of the substrate by reduced-pressure CVD. The resultant structure is heated in an oxidizing atmosphere. Subsequently, a second undoped polysilicon film 19 is deposited to a thickness of 40 nm by reduced-pressure CVD. A photoresist film 20 is processed by the lithography technique to have a space (opening width) of 220 nm. The photoresist film 20 is used as a mask to etch, by RIE, the second undoped polysilicon film 19 until the ONO film 18 is exposed.

The second undoped polysilicon film 19 is formed in order to prevent, as much as possible, diffusion of the impurity such as P into the vicinity of a tunnel oxide film that requires a high withstand voltage. The second undoped polysilicon film 19 will be finally doped by the diffusion of P from a P-doped polysilicon film.

Figure 7A:
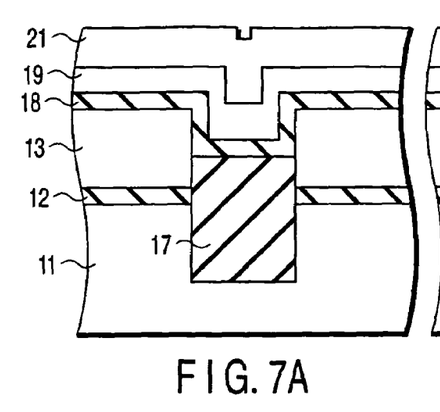
Figure 7B:
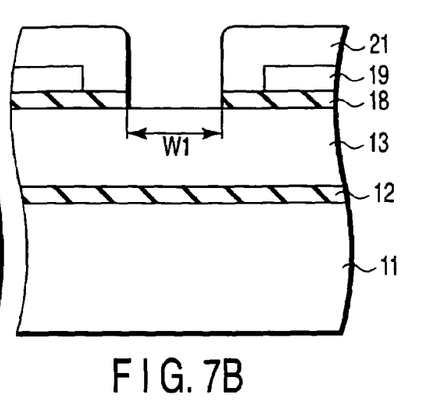

As is shown FIGS. 7A and 7B, the photoresist film 20 is removed, and a third P-doped polysilicon film 21 is deposited to a thickness of 60 nm on the ONO film 18 by reduced-pressure CVD. Using the third polysilicon film 21 as a spacer, RIE is performed to vertically process both the third polysilicon film 21 and ONO film 18 at the bottom of the slit as it is. Thereby, the ONO film 18 has a slit width w1 of about 100 nm. The third polysilicon film 21 will serve as a control gate in the memory cell transistor.

As has been described above, the slit width w1 is adjusted by the thickness of the third polysilicon film 21 that serves as the spacer. This will provide a much better controllability than the taper controllability of RIE.

Figure 8A:
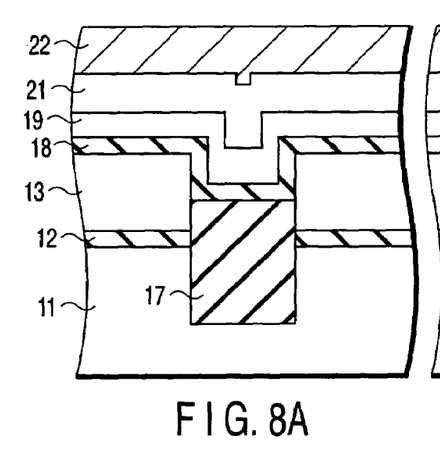
Figure 8B:
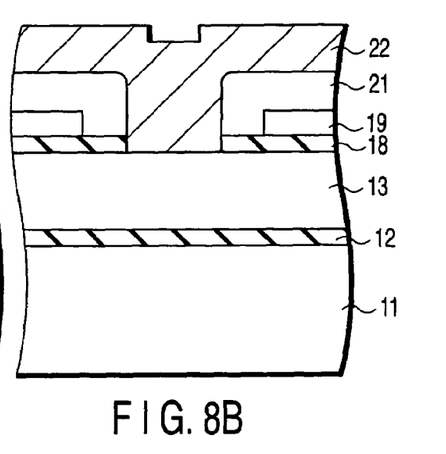

As shown FIGS. 8A and 8B, a tungsten silicide film 22 is deposited to a thickness of 800 Å by sputtering or CVD. Thereby, a gate electrode of the transistor other than the cell transistor, which comprises the doped polysilicon film 13 and tungsten silicide film 22, is formed. Thus, the device is completed.

Next, a second embodiment of the invention is described. The second embodiment is common to the first embodiment with respect to the fabrication steps illustrated in FIG. 2A through FIG. 5B. The common parts are denoted by like reference numerals, and the description is omitted.

Figure 9A:
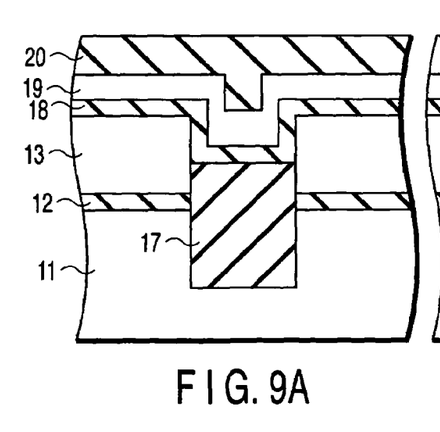
Figure 9B:
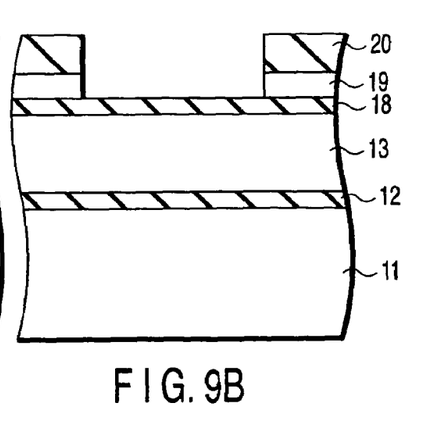

As is shown in FIGS. 9A and 9B, an ONO film 18 with a thickness of 17 nm is deposited on the surface of the substrate by reduced-pressure CVD. The resultant structure is heated in an oxidizing atmosphere. Subsequently, a second undoped polysilicon film 19 is deposited to a thickness of 40 nm by reduced-pressure CVD. A photoresist film 20 is processed by the lithography technique to have a space of 180 nm. The photoresist film 20 is used as a mask to etch the second undoped polysilicon film 19 until the ONO film 18 is exposed.

Figure 10A:
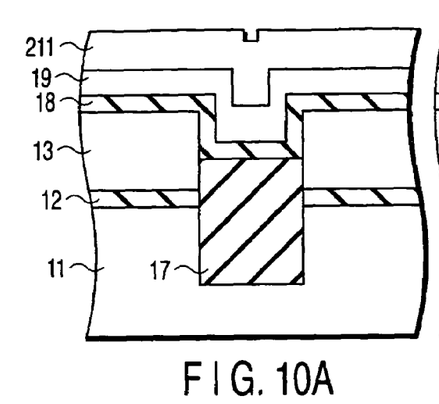
Figure 10B:
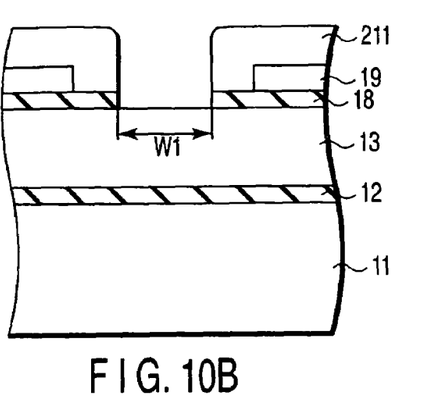

As is shown in FIGS. 10A and 10B, the photoresist film 20 is removed, and a third undoped polysilicon film 211 is deposited to a thickness of 40 nm on the ONO film 18 by reduced-pressure CVD. Using the third polysilicon film 211 as a spacer, RIE is performed to vertically process the third polysilicon film 211 and ONO film 18 at the bottom of the slit. Thereby, the ONO film 18 has a slit width w1 of about 100 nm.

Similarly with the third polysilicon film 21, the slit width w1 is adjusted by the thickness of the third polysilicon film 211 that serves as the spacer. This will provide a much better controllability than the taper controllability of RIE.

Figure 11A:
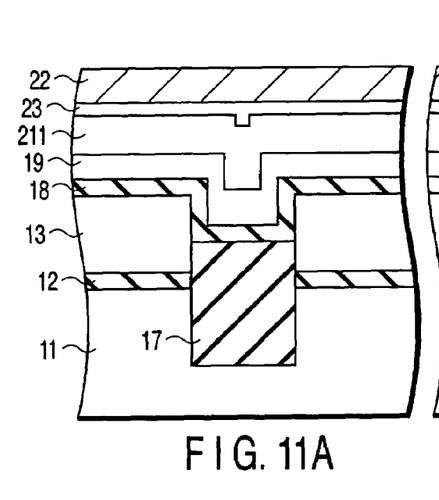
Figure 11B:
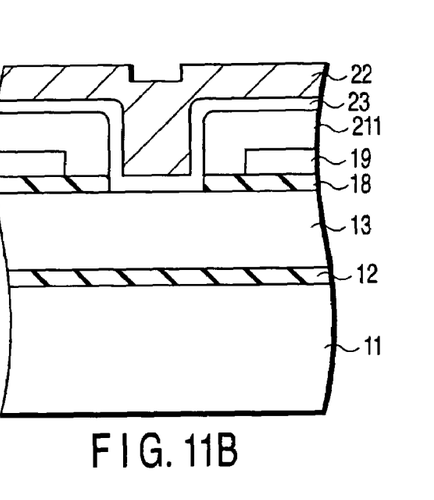

As is shown in FIGS. 11A and 11B, a fourth P-doped polysilicon film 23 with a thickness of 20 nm is formed on the exposed surface of the substrate, and a tungsten silicide film 22 is deposited to a thickness of 800 Å by sputtering or CVD. Thereby, a gate electrode of the transistor other than the cell transistor, which comprises the doped polysilicon film 13 and tungsten silicide film 22, is formed. Thus, the device is completed.

Other conductive material such as tungsten may be used as material of the control gate. Aside from the tungsten silicide that is used in the first and second embodiments, tungsten or doped polysilicon may be used.

Figure 12:
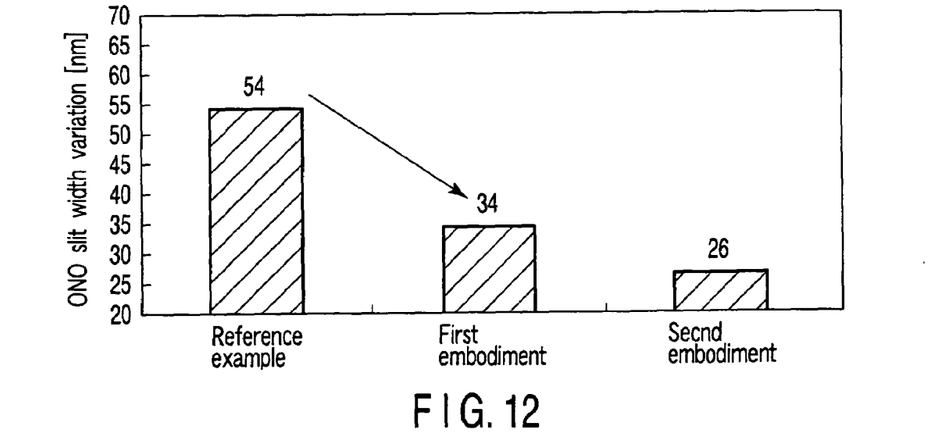
FIG. 12 is a graph showing variations in ONO slit width between the embodiments and a reference example.

In the above-described reference example, due to a variation in thickness of the BSG film and a variation in taper angle resulting from RIE processing of the BSG film, the dimensional precision in ONO slit width is low, as illustrated in FIG. 12. Specifically, the ONO slit width varies ±54 nm with respect to a target value of 100 nm. According to the present invention, however, the ONO slit width depends only on a variation in resist dimension and a variation in thickness of the polysilicon film 21, 211. The variation in the first embodiment is 34 nm, and that in the second embodiment is 26 nm. By processing the polysilicon film 21, 211 as a spacer, the dimensional controllability can remarkably be improved. Moreover, the fabrication steps are simplified, and the manufacturing cost can advantageously be reduced by 32%.

If a desired ONO slit width is secured, the resist dimension or the thickness of the polysilicon in process steps after the formation of the ONO film is not limited to the set value in the first and second embodiments.

Instead of the ONO film, a high-dielectric-constant film such as $Al_2O_3$ may be used.

The present invention is not limited to the above-described embodiments, and various modifications may be made, as is obvious to a person skilled in the art.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device whose gate structure of a transistor other than a memory cell transistor has a same stacked gate structure as the memory cell transistor, the gate structure comprising:
   a semiconductor substrate;
   a first insulation film provided on the semiconductor substrate;
   a first conductive film provided on the first insulation film;
   a second insulation film, provided on the first conductive film, having an opening;
   a spacer provided on the second insulation film to define the opening; and
   a second conductive film provided on the spacer and electrically connected to the first conductive film via the opening.

2. The nonvolatile semiconductor memory device according to claim 1, wherein the second conductive film is electrically connected to the first conductive film via a third conductive film.

3. The nonvolatile semiconductor memory device according to claim 1, wherein the spacer is composed of one selected from the group consisting of a doped polysilicon film and an undoped polysilicon film.

4. The nonvolatile semiconductor memory device according to claim 1, wherein the first conductive film and the third conductive film are composed of a doped polysilicon film.

5. The nonvolatile semiconductor memory device according to claim 1, wherein the second conductive film is composed of a conductive material such as tungsten silicide, tungsten, and doped polysilicon.

6. The nonvolatile semiconductor memory device according to claim 1, wherein the first conductive film serves as a floating gate in the memory cell transistor.

7. The nonvolatile semiconductor memory device according to claim 1, wherein the second conductive film serves as a control gate in the memory cell transistor.

8. The nonvolatile semiconductor memory device according to claim 1, wherein the second insulation film is one selected from an ONO film and a high dielectric constant film such as an $Al_2O_3$ film.

* * * * *